(12) United States Patent
Maute et al.

(10) Patent No.: US 8,823,037 B2
(45) Date of Patent: Sep. 2, 2014

(54) OPTOELECTRONIC SEMICONDUCTOR BODY AND OPTOELECTRONIC SEMICONDUCTOR CHIP

(75) Inventors: Markus Maute, Alteglofsheim (DE); Karl Engl, Pentling-OT Niedergebraching (DE)

(73) Assignee: OSRAM Opto Semiconductors GmbH (DE)

( * ) Notice: Subject to any disclaimer, the term of this patent is extended or adjusted under 35 U.S.C. 154(b) by 25 days.

(21) Appl. No.: 13/376,006

(22) PCT Filed: May 21, 2010

(86) PCT No.: PCT/EP2010/057073
§ 371 (c)(1),
(2), (4) Date: Jan. 19, 2012

(87) PCT Pub. No.: WO2010/139567
PCT Pub. Date: Dec. 9, 2010

(65) Prior Publication Data
US 2012/0168809 A1    Jul. 5, 2012

(30) Foreign Application Priority Data
Jun. 4, 2009    (DE) .......................... 10 2009 023 849

(51) Int. Cl.
*H01L 33/62*    (2010.01)
*H01L 33/38*    (2010.01)
*H01L 33/44*    (2010.01)
*H01L 33/20*    (2010.01)

(52) U.S. Cl.
CPC ............... *H01L 33/382* (2013.01); *H01L 33/44* (2013.01); *H01L 33/20* (2013.01)

USPC .................. 257/99; 257/98; 257/103; 257/79; 257/81; 438/22; 438/25; 438/27

(58) Field of Classification Search
USPC ............................................................ 257/99
See application file for complete search history.

(56) References Cited

U.S. PATENT DOCUMENTS 5,708,280 A * 1/1998 Lebby et al. .................... 257/88
5,821,571 A * 10/1998 Lebby et al. .................... 257/98
6,084,175 A    7/2000 Perry et al.
(Continued)

FOREIGN PATENT DOCUMENTS

DE            44 43 424 A1    6/1995
DE    10 2007 019 755 A1    10/2008
(Continued)

OTHER PUBLICATIONS

Japanese Examination Report dated Jan. 7, 2014 for Japanese Application No. 2012-513539.

*Primary Examiner* — Julio J Maldonado
*Assistant Examiner* — Jaehwan Oh
(74) *Attorney, Agent, or Firm* — DLA Piper LLP (US)

(57) ABSTRACT

An optoelectronic semiconductor body has a front face provided for the emission and/or reception of electromagnetic radiation, a rear face which lies opposite the front face and is provided for application onto a support plate, and an active semiconductor layer sequence which in the direction from the rear face to the front face includes a layer of a first conductivity type, an active layer and a layer of a second conductivity type in this sequence.

18 Claims, 8 Drawing Sheets

(56) References Cited

U.S. PATENT DOCUMENTS

| | | |
|---|---|---|
| 6,657,237 B2 | 12/2003 | Kwak et al. |
| 7,058,106 B2 * | 6/2006 | Widjaja et al. ............ 372/50.124 |
| 7,335,916 B2 * | 2/2008 | Kim et al. ........................ 257/70 |
| 7,982,236 B2 * | 7/2011 | Sano et al. ...................... 257/99 |
| 2002/0117681 A1 | 8/2002 | Weeks et al. |
| 2004/0211972 A1 * | 10/2004 | Du et al. ......................... 257/99 |
| 2005/0056855 A1 | 3/2005 | Lin et al. |
| 2005/0133807 A1 | 6/2005 | Park et al. |
| 2007/0012939 A1 * | 1/2007 | Hwang et al. .................. 257/99 |
| 2007/0096130 A1 | 5/2007 | Schiaffino et al. |
| 2007/0176188 A1 * | 8/2007 | Tanaka et al. ................... 257/88 |
| 2007/0295985 A1 | 12/2007 | Weeks et al. |
| 2008/0145961 A1 * | 6/2008 | Horio et al. ..................... 438/29 |
| 2008/0191215 A1 * | 8/2008 | Choi et al. ....................... 257/76 |
| 2010/0163895 A1 * | 7/2010 | Horie ............................... 257/98 |
| 2010/0171135 A1 | 7/2010 | Engl et al. |
| 2011/0278734 A1 * | 11/2011 | Yen et al. ....................... 257/774 |

FOREIGN PATENT DOCUMENTS

| | | |
|---|---|---|
| DE | 10 2007 022 947 A1 | 10/2008 |
| JP | 2004-47988 | 2/2004 |
| TW | 2009/03863 A | 1/2009 |
| WO | 2007/023419 | 3/2007 |
| WO | 2008/047325 | 4/2008 |
| WO | 2008/069482 | 6/2008 |
| WO | 2008/131735 A1 | 11/2008 |
| WO | 2010/139567 A2 | 12/2010 |

\* cited by examiner

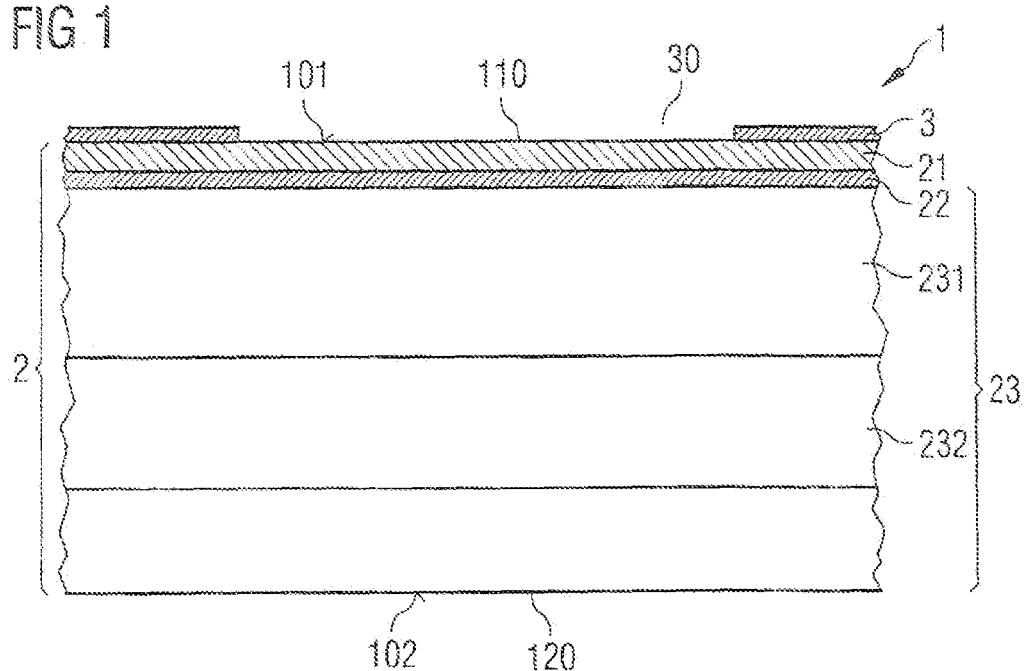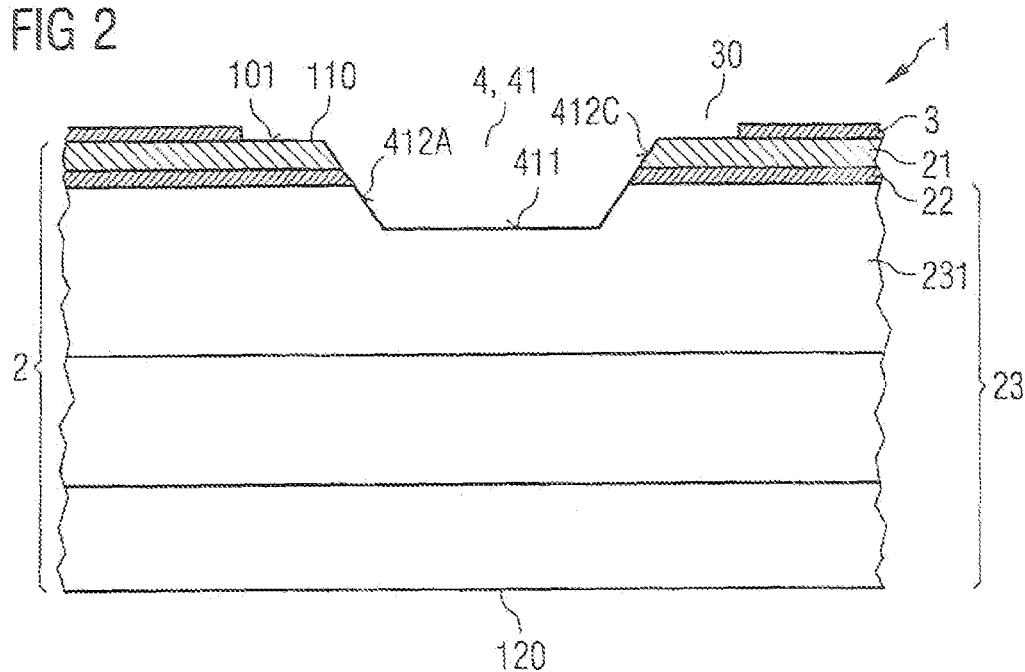

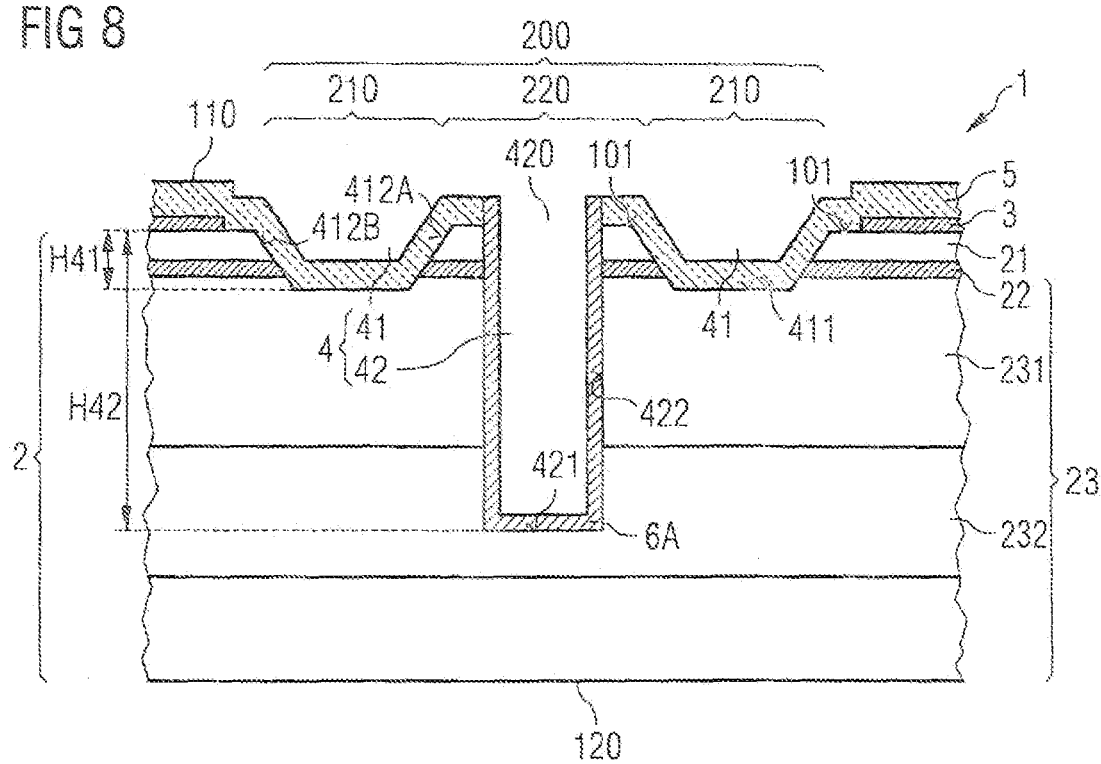
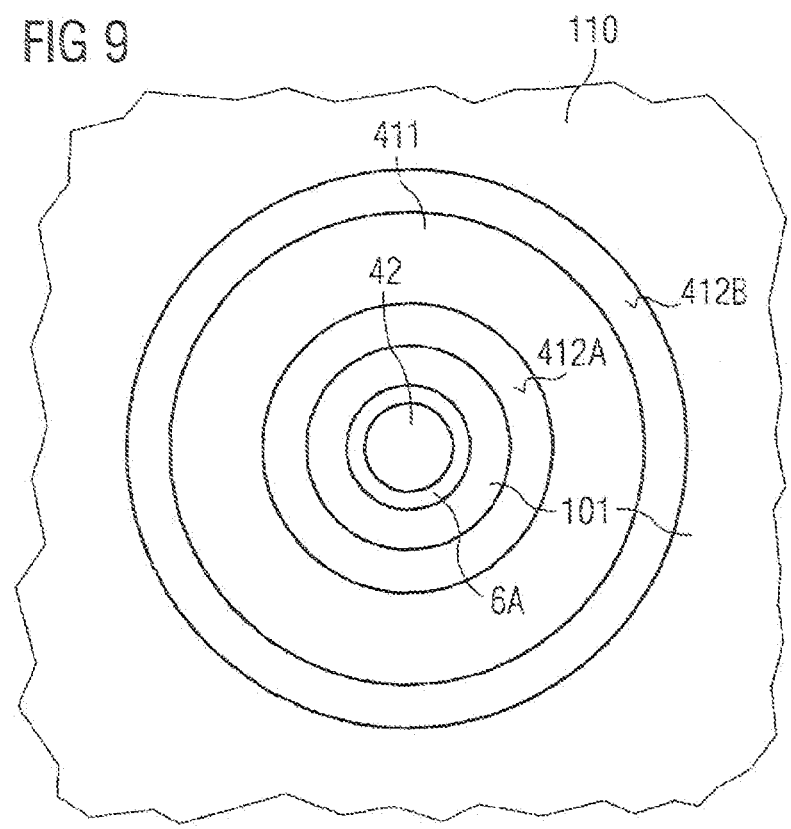

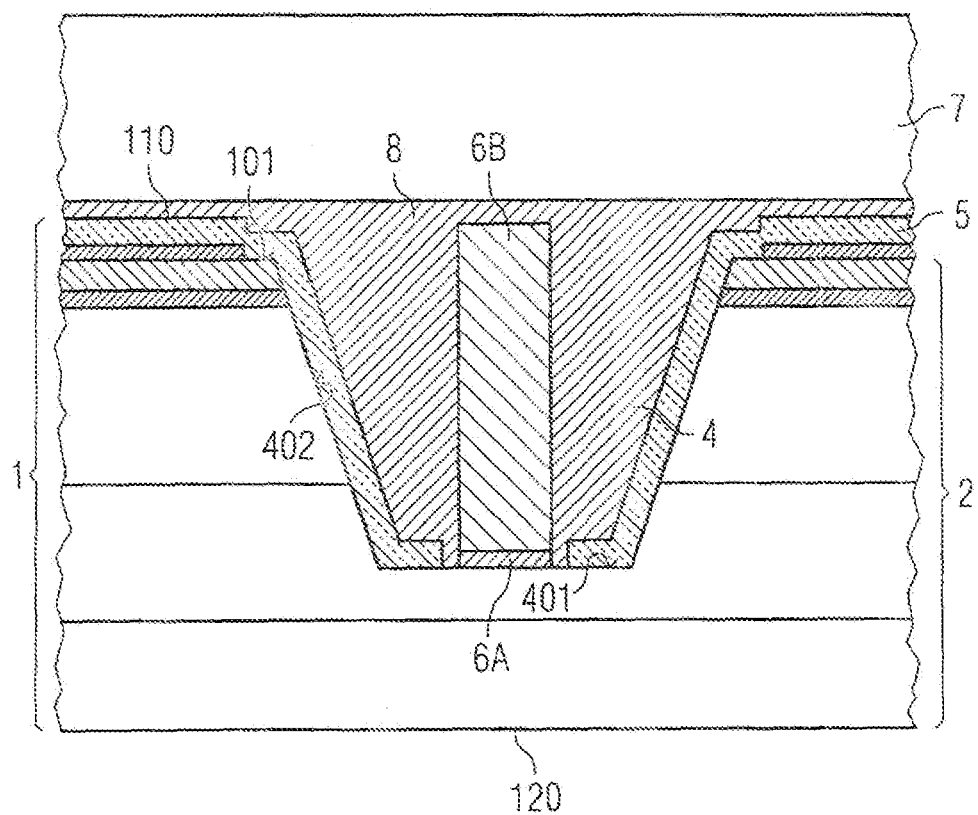

OPTOELECTRONIC SEMICONDUCTOR BODY AND OPTOELECTRONIC SEMICONDUCTOR CHIP

CROSS REFERENCE TO RELATED APPLICATIONS

This is a §371 of International Application No. PCT/EP2010/057073, filed on May 21, 2010 (WO 2010/139567, published Dec. 9, 2010), which claims the priority of German Application No. 10 2009 023849.2, filed on Jun. 4, 2009, the entire contents of which are hereby incorporated by reference.

TECHNICAL FIELD

This disclosure relates to an optoelectronic semiconductor body and an optoelectronic semiconductor chip having an optoelectronic semiconductor body.

BACKGROUND

Optoelectronic semiconductor bodies are known which contain a semiconductor layer sequence having a p-conductive layer, a radiation-emitting active layer and an n-conductive layer, wherein blind holes extend through the p-conductive layer and the active layer into the n-conductive layer, through which the n-conductive layer can be electrically connected. If such semiconductor bodies are applied to a support plate by solder, there is the risk that the solder will not completely fill the blind holes, but rather that cavities will remain between the semiconductor body and the support plate. The semiconductor chip can then have reduced efficiency or can be completely unusable.

It could therefore be helpful to provide a semiconductor body and a semiconductor chip in which this risk is reduced.

SUMMARY

We provide an optoelectronic semiconductor body including a front face provided for emission and/or reception of electromagnetic radiation, a rear face which lies opposite the front face and is provided for application onto a support plate, and an active semiconductor layer sequence which in a direction from the rear face to the front face includes a layer of a first conductivity, an active layer and a layer of a second conductivity in this sequence, wherein the semiconductor layer sequence includes at least one recess which extends from the rear face into the semiconductor layer sequence; the recess includes a first portion which extends through the layer of the first conductivity and the active layer into the layer of the second conductivity and includes in the layer of the second conductivity a base surface; the recess includes a second portion having an opening, wherein in a plan view of the rear face the opening is completely surrounded by an outer contour of the base surface of the first portion and the second portion extends starting from the opening in the direction towards the front face and extends at least in the layer of the second conductivity type.

We also provide an optoelectronic semiconductor chip including a support plate and an optoelectronic semiconductor body including a front face provided for emission and/or reception of electromagnetic radiation, a rear face which lies opposite the front face, faces towards the support plate and is attached thereto by a solder, and an active semiconductor layer sequence which in the direction from the rear face to the front face includes a layer of a first conductivity, an active layer and a layer of a second conductivity in this sequence and has at least one recess which extends from the rear face into the semiconductor layer sequence and extends through the layer of the first conductivity and the active layer into the layer of the second conductivity, wherein at least one third of the volume of the recess starting from a front-sided base surface of the recess is filled with a metal layer consisting of a material which is different from the solder.

BRIEF DESCRIPTION OF THE DRAWINGS

FIG. 1 shows a schematic cross-sectional view of an optoelectronic semiconductor body in a first stage of an example of a method of producing the same.

FIG. 2 shows a schematic cross-sectional view of the semiconductor body in a second stage of the method.

FIG. 8 shows a schematic cross-sectional view of an optoelectronic semiconductor body in accordance with a second example.

FIG. 9 shows a schematic plan view of a section of the rear face of the optoelectronic semiconductor body in accordance with the second example.

FIG. 10 shows a schematic cross-sectional view of an optoelectronic semiconductor chip in accordance with a second example.

DETAILED DESCRIPTION

Figure 3:
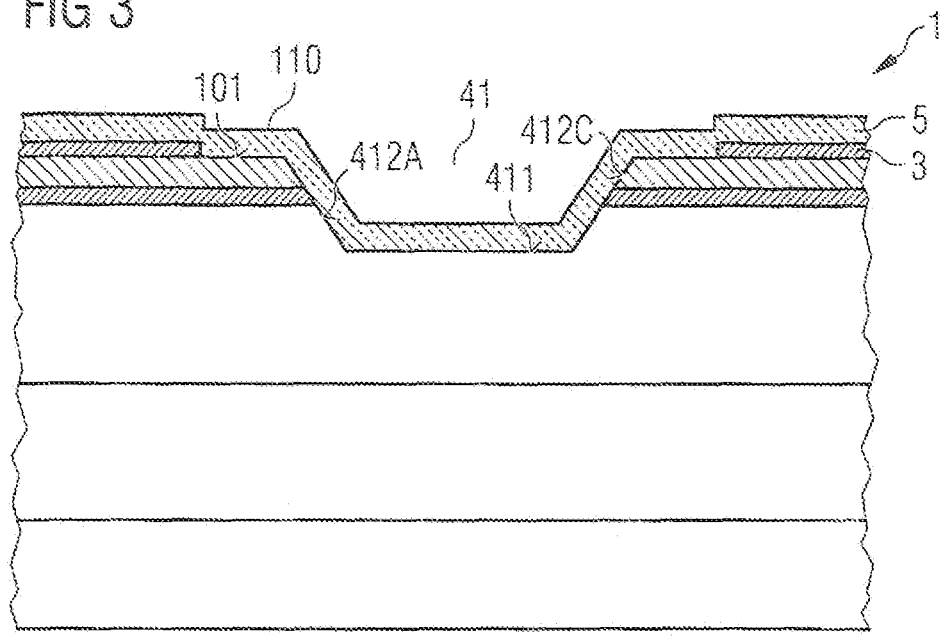
FIG. 3 shows a schematic cross-sectional view of the semiconductor body in a third stage of the method.

We provide an optoelectronic semiconductor body. The semiconductor body has a front face provided for the emission and/or reception of electromagnetic radiation. Moreover, it has a rear face which lies opposite the front face and is provided in particular for application onto a support plate.

The semiconductor body comprises an active semiconductor layer sequence which in particular is a sequence of inorganic, preferably epitaxial semiconductor layers. The active semiconductor layer sequence is provided for the emission and/or reception of electromagnetic radiation, in particular of infrared, visible and/or ultraviolet light.

The active semiconductor layer sequence comprises, in the direction from the rear face towards the front face, a layer of a first conductivity type, e.g. a p-conductive layer, an active layer and a layer of a second conductivity type, e.g. an n-conductive layer, in this sequence. The active layer expediently contains a pn-transition, a double heterostructure, a single quantum well structure or a multiple quantum well structure for generating radiation and/or detecting radiation.

The semiconductor layer sequence may comprise at least one recess which extends from the rear face into the semiconductor layer sequence. Preferably, it comprises a plurality of such recesses.

Preferably, the recess comprises a first portion which extends through the layer of the first conductivity type and through the active layer into the layer of the second conductivity type. The first portion has a base surface located in the layer of the second conductivity type. The first portion contains in particular a more rear-sided boundary region of the recess which adjoins a rear-sided main surface of the semiconductor layer sequence. For example, an opening of the first portion is contained in the rear-sided main surface.

The recess additionally may contain a second portion. The second portion has an opening which in the plan view of the rear face of the semiconductor body is completely surrounded by an outer contour of the base surface of the first portion. Starting from its opening, the second portion extends in the direction towards the front face of the semiconductor body. In particular, it extends at least in the layer of the second conductivity type. Preferably, the second portion has a base surface which is located in the layer of the second conductivity type.

A front-sided base surface of the recess, preferably the base surface of the second portion, may be covered at least in places with a metal layer. The term "metal layer" is understood to refer to layers and layer sequences which contain or consist of at least one metal and/or an alloy of at least two metals. For example, the metal layer is a silver layer or a layer sequence of a silver layer and a gold layer, wherein the silver layer is adjacent in particular to the semiconductor layer sequence and the gold layer follows the silver layer in the direction away from the semiconductor layer sequence.

The metal layer is connected e.g. in an electrically conductive connection to the layer of the second conductivity type. In particular, the metal layer is provided for the purpose of electrically connecting the layer of the second conductivity type from the rear face through the recess.

The second portion of the recess may be filled at least partially with the metal layer. For example, the second portion is filled completely with the metal layer.

The metal may protrude in the direction of the rear face beyond the opening of the second portion. For example, it protrudes in the manner of a column into the first portion. In this case, the metal is disposed in particular in a central region of the first portion, whereas a boundary region which is circumferential, in particular completely circumferential, with respect to the central region, is free of the metal.

A surface of the first portion may be coated at least in places with an electrically insulating layer, e.g. with a dielectric layer, such as an SiO2 layer or a silicon nitride layer such as an Si3N4 layer. Preferably, the surface of the first portion is coated with the electrically insulating layer at least in the region of the layer of the first conductivity type and the active layer. In this manner, the risk of a short-circuit of the active layer is reduced. Further, the surface of the second portion—or at least the base surface or a part of the base surface of the second portion—may be free of electrically insulating layers.

The base surface of the first portion may have a region which in a plan view of the rear face is completely circumferential with respect to the opening of the second portion and which has a minimal lateral extension of greater than or equal to 1 μm, preferably greater than or equal to 2 μm. The outer contour of the base surface of the first portion may surround a region whose surface area is at least one quarter larger than the surface area of the opening of the second portion. Preferably, the surface area of the region surrounded by the outer contour of the base surface of the first portion is at least twice as large as the surface area of the opening of the second portion.

The first portion may have a depth of less than or equal to 500 nm, e.g. a depth between 200 nm and 400 nm, wherein the limits are included. The second portion has e.g. a depth of greater than or equal to 1 μm. The maximum lateral extension of the opening of the second portion may be less than or equal to three quarters of the maximum lateral extension of an outer contour of the opening in the first portion. For example, the maximum lateral extension of the outer contour of the opening in the first portion is greater than or equal to 50 μm. The maximum lateral extension of the opening of the second portion is e.g. less than or equal to 30 μm.

We also provide an optoelectronic semiconductor body in which at least one third of the volume of the recess is filled with the metal layer. In particular, the metal layer extends from the front-sided base surface of the recess or from the base surface of the second portion in the direction towards the rear face.

In a plan view of the rear face, the metal layer may cover a partial region, i.e., a central region, of the front-sided base surface. In particular, the recess comprises a region which is circumferential with respect to the metal layer and which is free of the metal layer.

The metal layer may protrude in the direction of the rear face beyond the semiconductor layer sequence. For example, in a plan view of the rear face a boundary region of the metal layer, in particular a circumferential boundary region of the metal layer, protrudes beyond the recess. A central region of the metal layer does not protrude beyond the semiconductor layer sequence, for example.

The opening of the second portion of the semiconductor body may be contained in the base surface of the first portion. In this case, the second portion extends preferably completely within the layer of the second conductivity type.

Alternatively, the first portion is formed as a trench which runs around the opening of the second portion. In this case, the second portion extends preferably through the layer of the first conductivity type and through the active layer into the layer of the second conductivity type.

In particular, in a plan view of the rear face the first portion completely surrounds a region of the semiconductor layer sequence which comprises a central region and a boundary region which completely surrounds the central region. The first portion constitutes a trench—in other words: a channel—which is contained in the boundary region and completely surrounds the central region. The opening of the second portion is disposed in particular within the central region.

The recess, in particular the first portion of the recess, may comprise a side surface which extends obliquely with respect to a main extension plane of the semiconductor layer sequence. In other words, the side surface is inclined in relation to the main extension plane.

An "oblique" or "inclined" progression is understood to mean that in at least one sectional plane which is spanned by a surface normal to a point on the side surface and by the normal vector to the main extension plane, the angle between the side surface and the main extension plane is less than 90°. In particular, it is less than 60°, e.g. it is about 45°. In particular, the inclination is formed such that the recess tapers in the direction from the rear face towards the front face.

For example, the side surface is a side surface which is completely circumferential with respect to the recess. Alternatively, the recess can also comprise a plurality of side surfaces—e.g. if it has a rectangular contour—which together laterally delimit the recess. At least one, preferably each, of these side surfaces extends e.g. at least in the region of the first portion in an oblique manner with respect to the main extension plane of the semiconductor layer sequence.

For example, the side surface(s) constitute, in the region of the first portion, a truncated cone or a truncated pyramid. Such side surfaces which extend in an inclined manner serve to facilitate reliable coverage of the active layer by the electrically insulating layer so that the risk of a short-circuit of the active layer is particularly low.

Preferably, the side surface(s) of the first portion extends more flatly than the side surface(s) of the second portion. In particular, the side surface(s) of the second portion extends perpendicularly or at least almost perpendicularly with respect to the main extension plane of the semiconductor layer sequence. For example, in at least one sectional plane, preferably in all sectional planes, which are spanned by a surface normal to an, in particular random, point on the side surface and by the normal vector to the main extension plane, the angle between the side surface and the main extension plane is greater than or equal to 70°, e.g. greater than or equal to 80°.

In a plan view of the rear face the recess may have a cross-shaped cross-section or a star-shaped cross-section. In the case of such a shape, it is advantageously possible to achieve a volume of the recess which is particularly small in comparison with the surface area of the front-sided base surface, in particular the base surface of the second portion.

The semiconductor body may comprise a plurality of recesses having a cross-shaped or star-shaped cross-section which are disposed e.g. on the grid points of a notional grid—i.e. a rectangular or square grid. A strip-shaped recess may be disposed between two, in particular between every two, of the cross-shaped or star-shaped recesses. In particular, in a plan view of the rear face, a "strip-shaped" recess has, in two mutually perpendicular directions, maximum lateral extensions which differ by a factor of greater than or equal to 2, e.g. by a factor of greater than or equal to 5.

We further provide an optoelectronic semiconductor chip which comprises an optoelectronic semiconductor body having a recess or a plurality of recess, as described above.

The semiconductor chip additionally may comprise a support plate which, for example, contains or consists of Si or Ge. In this case, preferably the rear face of the semiconductor body faces towards the support plate.

The semiconductor body may be attached to the support plate by solder. In particular, the solder fills the recess. For example, the solder fills at least the first portion of the recess. Preferably, the solder is different from the material of the metal layer. For example, AuSn, AuIn or In is used as the solder.

The fact that the solder "fills" the recess/the first portion means in particular that the region enclosed by the recess/the first portion is filled, in particular completely filled, with the solder, insofar as it is left free of the electrically insulating layer and the metal layer. In some cases, in which the recess, in particular the second portion of the recesses, contains a metal layer, and/or the recess, in particular the first portion of the recess, contains an electrically insulating layer, this is to be understood in particular as meaning that the solder fills the region of the recess which has been left free of the metal layer and/or the electrically insulating layer. For example, the metal layer may cover a partial region of the front-sided base surface of the recess, a region of the recess which may be circumferential with respect to the metal layer may be filled with the solder.

In the case of the semiconductor bodies, the volume of the recess, in particular the volume of the recess which has been left free of the metal layer, is advantageously particularly small. For example, it is 1000 µm3 or less, in particular 500 µm3 or less. For example, it is between 300 µm3 and 500 µm3, wherein the limits are included. In particular, this reduces the risk that during production of the semiconductor chip cavities remain in the recess which are not filled with solder. In particular, the risk of the semiconductor chip having reduced efficiency or being unusable is thus also reduced.

Further advantageously, a solder stop layer, which contains TiWN, for example, may be disposed between the metal layer and the solder. In particular, the solder stop layer is provided for the purpose of reducing or preventing mixing of the solder and the metal layer. The solder stop layer may be disposed at least above the entire surface of the recess and in particular above the entire surface of the rear-sided main surface of the semiconductor body.

In the case of the semiconductor body, the layer of the second conductivity type may protrude beyond the active layer and the layer of the first conductivity type. In particular, the layer of the second conductivity type forms a protrusion which is laterally circumferential with respect to the semiconductor layer sequence.

Preferably, in the case of the semiconductor chip the layer of the second conductivity type together with the support plate thus forms a groove which is circumferential with respect to the semiconductor layer sequence and through which the main extension plane of the active layer extends. The groove may be filled with the solder. Preferably, the extension of the groove in the direction from the front face to the rear face is less than or equal to 500 nm. In the case of such an extension, the risk of cavities forming within the groove which are free of the solder is advantageously particularly low.

A surface region of the semiconductor layer sequence may be provided, at least in the region of the groove, with a passivation layer. The passivation layer is arranged in particular between the semiconductor layer sequence and the solder. In the case of such a semiconductor chip, the active layer is advantageously protected in a particularly effective manner after the semiconductor body has been applied to the support plate. For example, during subsequent process steps to produce the semiconductor chip—like etching of mesas into the semiconductor layer sequence—the active layer advantageously does not need to be exposed.

A boundary region of the support plate of the semiconductor chip may protrude laterally beyond the semiconductor layer sequence. In particular, the passivation layer extends laterally from the semiconductor layer sequence at least over a part of the boundary region of the support plate, such that the groove which is filled with solder is extended laterally beyond the semiconductor layer sequence.

In the direction from a central region towards an edge of the support plate, the passivation layer initially may run in the direction of the front face away from the support plate to form the groove and subsequently in the direction towards the support plate. Preferably, in the direction from the central region, which is covered by the semiconductor layer sequence, towards the edge of the support plate, the passivation layer initially runs in the central region in the direction of the front face away from the support plate to form the groove and subsequently runs in the boundary region of the support plate in the direction towards the support plate. The groove extends in this manner in a lateral direction over a part of the boundary region, but preferably not to the edge of the support substrate. In this manner, the volume of the groove to be filled with the solder is advantageously particularly small.

We further provide a method of producing a semiconductor chip.

Preferably, the provided optoelectronic semiconductor body is comprised of a semiconductor wafer which comprises the semiconductor layer sequence and which in a subsequent method step is divided into a plurality of semiconductor bodies, for example, by the etching of mesas. The support plate is comprised, for example, of a support plate wafer which in a subsequent method step is divided into individual support plates, e.g. by laser cutting. The method is described hereinafter with reference to a semiconductor body and a support plate. Instead of this, a semiconductor wafer and/or a support plate wafer can also be used in each case.

The optoelectronic semiconductor body and the support plate are provided in a first step of the method.

The rear face of the semiconductor body or a surface of the support plate is provided with the solder in a further, in particular subsequent, method step. Alternatively, the rear side of the semiconductor body can be provided with a first component of the solder and a surface of the support plate can be provided with a second component of the solder.

In a subsequent method step, the semiconductor body is disposed on the support plate such that its rear face faces towards the support plate, and the solder, or the first and second components of the solder, is/are disposed between the semiconductor body and the support plate.

The recess or the first portion of the recess may be filled at least partially with a metal layer consisting of a material which is different from the solder, before the semiconductor body is disposed on the support plate.

In a subsequent method step, a mechanically stable connection is established between the semiconductor body and the support plate, wherein the solder is melted. In this method step, the solder fills the recess or the recesses in the semiconductor body. If a first component of the solder has been applied to the semiconductor body and a second component of the solder has been applied to the support plate, in this method step both components mix in particular to form the solder.

Further advantages and developments of the semiconductor body, the semiconductor chip and the method are apparent from the following examples which are explained in conjunction with the drawings.

In the examples and drawings, like components or components which function in a similar manner are designated by the same reference numerals. The drawings and the size ratios of the elements which are illustrated in the drawings are not to be interpreted as being true to scale. On the contrary, individual elements, e.g. layers, can be illustrated to be excessively large to provide a better understanding and/or better representability.

FIG. 1 illustrates a schematic cross-sectional view of an optoelectronic semiconductor body in accordance with a first example in a first stage of an example of a method of producing the same.

The semiconductor body 1 comprises an active semiconductor layer sequence 2. The semiconductor layer sequence 2 contains a layer of a first conductivity type, in this case a p-conductive layer 21. Moreover, the semiconductor layer sequence 2 contains an active layer 22 which comprises a multiple quantum well structure for generating radiation, for example. In addition, the semiconductor layer sequence 2 contains a layer of a second conductivity type, in this case an n-conductive layer 23.

The p-conductive layer 21, the active layer 22 and the n-conductive layer 23 follow on from each other in this sequence from a rear face 110 towards a front face 120 of the semiconductor body 1 in this sequence. In accordance with this first example, the optoelectronic semiconductor body 1 is provided for the emission of visible light from its front face 120. It is also feasible for the n-face and the p-face to be interchanged so that in the direction from the rear face 110 towards the front face 120 the n-conductive layer, the active layer and the p-conductive layer follow on from each other in this sequence.

The n-conductive layer 23 has an optional first region 231 which contains an n-dopant in a first concentration, and has an optional second region 232 which contains an n-dopant in a second concentration. The first region 231 is arranged between the active layer 22 and the second region 232. The second concentration is greater than the first concentration. In particular, it is at least five times as great as the first concentration. For example, the first concentration is between 0 and 5×1018 atoms per cubic centimeter, wherein the limits are included. The second concentration is preferably greater than or equal to 5×1018 atoms per cubic centimeter, particularly preferably greater than or equal to 1×1019 atoms per cubic centimeter.

A first metallic contact layer 3 is applied to a rear-sided main surface 101 of the semiconductor layer sequence 2. The first metallic contact layer is a p-contact layer 3.

The p-contact layer 3 is applied in a structured manner or is structured after application, so that it comprises a plurality of cut-outs 30, one of which is illustrated in FIG. 1.

FIG. 2 illustrates a second stage of the method, in accordance with which in a first method step recesses 4 have been produced in the semiconductor layer sequence 2 in the region of the cut-outs 30 of the p-contact layer 3. In the case of the example of FIG. 2, in a central region of the cut-outs 30 material is removed in this method step from the semiconductor layer sequence to produce the recess 4, whereas in a boundary region of the cut-out 30 no material is removed from the semiconductor layer sequence 2, so that the boundary region is not affected by the recess 4.

Alternatively, the recess 4 can extend laterally over the entire region of the cut-out 30. This is advantageous for example if the p-contact layer 3 is provided with the cut-outs 30 only after it has been applied to the semiconductor layer sequence 2. In this case, a masking layer which is, for example, applied to the p-contact layer 3 for the purpose of producing the cut-outs 30 can also be used as a masking layer for the purpose of producing the recess 4. For example, the masking layer is a photoresist layer and the structuring of the p-contact layer 3 and/or the production of the recesses 4 comprises a photolithography step.

The first portion 41 of the recess 4 extends from the rear face 110 into the semiconductor layer sequence 2. It passes through p-conductive layer 21 and the active layer 22 completely and extends into the n-conductive layer 23, in particular into the first region 231 of the n-conductive layer 23.

In the n-conductive layer 23 or in the first region 231 thereof, the first portion 41 of the recess 4 terminates with a base surface 411. The first portion 41 is delimited laterally by side surfaces 412A, 412B, 412C and 412D which completely laterally surround the base surface 411.

An example of a variant, in which the first portion 41 has four side surfaces 412A, 412B, 412C and 412D is a first portion 41 having a rectangular or square basic surface. The side surfaces 412A, 412B, 412C and 412D then constitute the peripheral surfaces of a truncated pyramid.

Figure 7A:
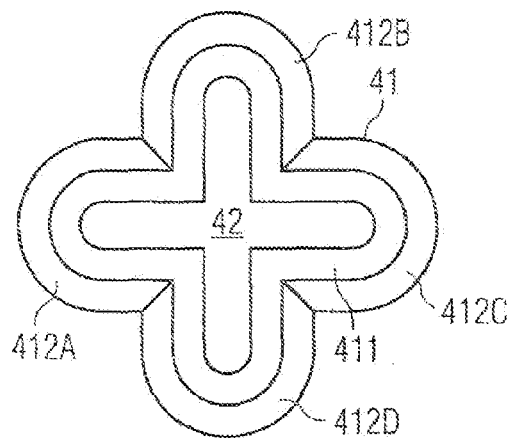
FIGS. 7A, 7B and 7C show examples of recesses in the semiconductor layer sequence of the optoelectronic semiconductor body in accordance with the first example in schematic plan views of a section of the rear face thereof.

However, the recess 4 is designed in the form of a cross, as FIG. 7A schematically illustrates in a plan view of a section of the rear face 110 of the semiconductor body 1 in accordance with the first example.

The side surfaces 412A, 412B, 412C. 412D are U-shaped in plan view and in each case abut at a limb of the "U" against an adjacent side surface.

Figure 7B:
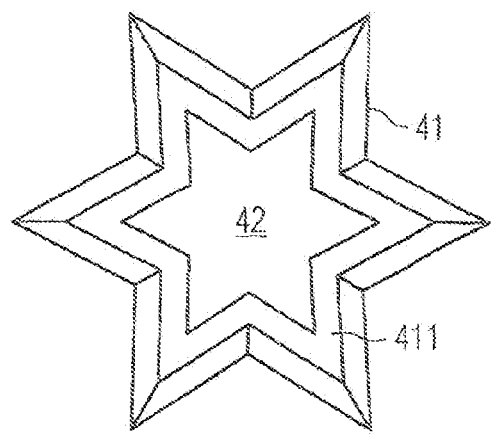

FIG. 7B illustrates in a plan view of a section of the rear face 110 of the semiconductor body 1 another variant, in which the recess has a star-shaped cross-section. In this case, the recess has more than four side surfaces. In particular, it has two side surfaces per vertex of the star.

Depending upon the shape, the first portion 41 can alternatively also comprise a single side surface 412 which completely surrounds the base surface 412 and in particular is formed in an annular manner. An example of a variant having a single side surface 412 is a first portion 41 having a circular or elliptical basic surface. The side surface 412 then constitutes the peripheral surface of a truncated cone, for example.

Figure 7C:
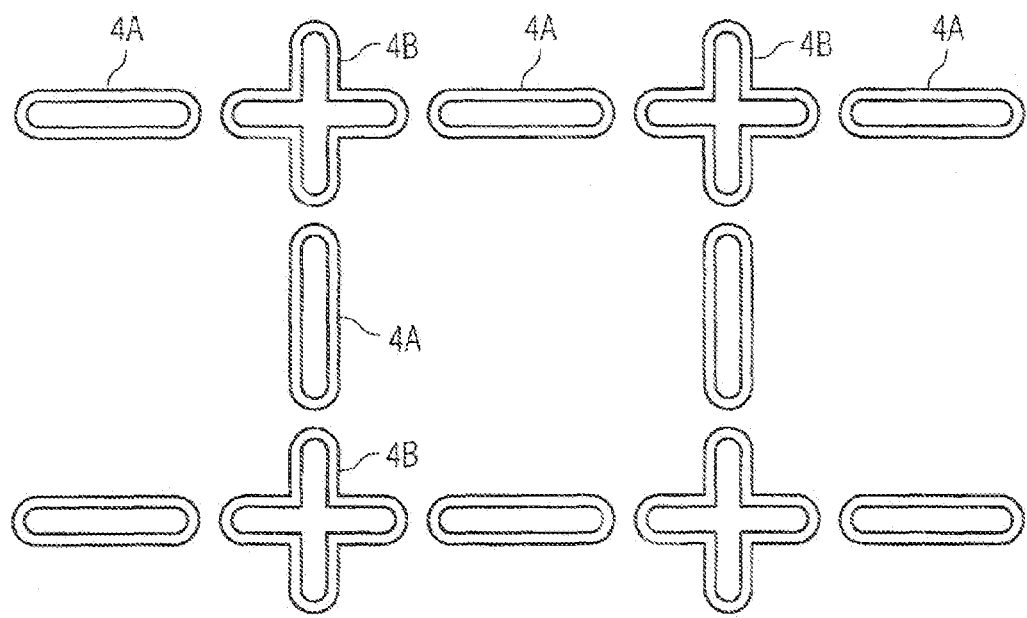

FIG. 7C illustrates a further variant of the semiconductor body 1 in a schematic plan view of a section of the rear face 110 thereof. In this case, the semiconductor body comprises a plurality of recesses 4B which have a cross-shaped cross-section and are disposed on the grid points of a notional rectangular or square grid. Disposed between every two of the cross-shaped recesses 4B is a strip-shaped recess 4A.

In this case, the side surfaces 412A, 412B, 412C and 412D of the first portion 41 extend obliquely with respect to the main extension plane of the semiconductor layer sequence. In particular, the main extension plane is that plane which is located perpendicularly with respect to a distance vector from a rear-sided main surface 101 to a front-sided main surface 102 of the semiconductor layer sequence 2. In particular, the main extension plane is in parallel with the rear-sided main surface 101 and/or with the front-sided main surface 102 of the semiconductor layer sequence 2.

Such an oblique progression of the side surfaces 412A-412D can be achieved, for example, by rounding off the flanks of the masking layer, by which the first portion is produced. In particular, in the case of a photoresist layer this can be performed by heating the photoresist layer after the photolithography step for structuring thereof.

FIG. 3 illustrates the optoelectronic semiconductor body 1 in a third, subsequent stage of the method. In this stage, the rear face 110 of the semiconductor body 1 is coated with an electrically insulating layer 5. The electrically insulating layer consists of silicon dioxide or of silicon nitride, for example. The electrically insulating layer 5 covers the p-contact layer 3, the rear-sided main surface 101 of the semiconductor layer sequence 2 and the surface of the first portion 41 of the recess 4, in particular the base surface 411 thereof and the side surfaces 412A-412D thereof.

Figure 4:
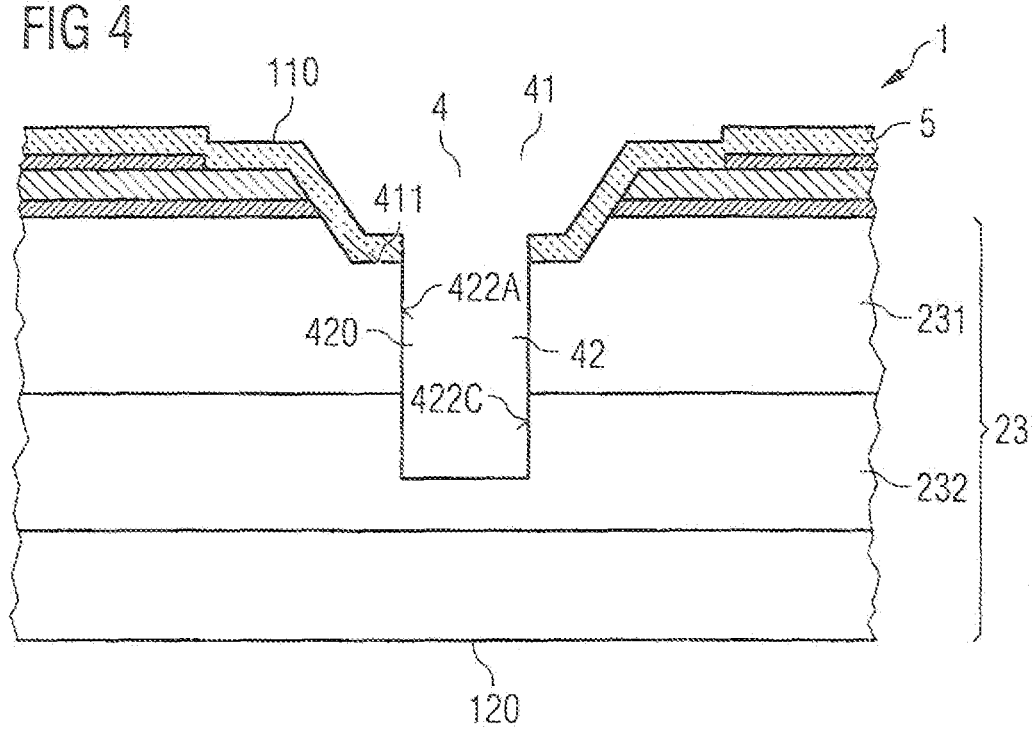
FIG. 4 shows a schematic cross-sectional view of the semiconductor body in a fourth stage of the method.

FIG. 4 illustrates a fourth, subsequent stage of the method of producing the semiconductor body 1. This stage illustrates the semiconductor body 1, after a second portion 42 of the recess 4 has been produced in a Method step subsequent to the third stage.

The second portion 42 has an opening 420 which in this case is contained in the base surface 411 of the first portion 41. Starting from the opening 420, the second portion 42 of the recess 4 extends in the direction towards the front face 120 of the semiconductor body.

The second portion does not pass completely through the semiconductor layer sequence 2 in the direction towards the front face 120, but rather terminates within the n-conductive layer 23. In this case, the second portion 42 terminates with its base surface 421 within the second region 232 of the n-conductive layer 23. In this case, the second portion 42 extends completely within the n-conductive layer, i.e. within the layer of the second conductivity type 23.

In a plan view of the rear face 110, the opening 420 of the second portion is completely surrounded by an outer contour of the base surface 411 of the first portion 41. The side surfaces 422A, 422B, 422C and 422D or the side surface 422 extend preferably perpendicularly or almost perpendicularly with respect to the main extension plane of the semiconductor body 1. In particular, they form a larger angle together with the main extension plane than the side surfaces 412A-412D or the side surface 412 of the first portion 41.

The side surface 422 or the side surfaces 422A, 422B, 422C and 422D are not covered by the electrically insulating layer 5.

In a plan view of the rear face 110, the surface area of the opening 420 is smaller than the surface area of a region which is surrounded by an outer contour of the first portion 41. Preferably, the surface area of the opening 420 is at most half of the surface area of the region, which is surrounded by the outer contour of the first portion 41, in a projection upon the main extension plane of the semiconductor body 1.

Figure 5:
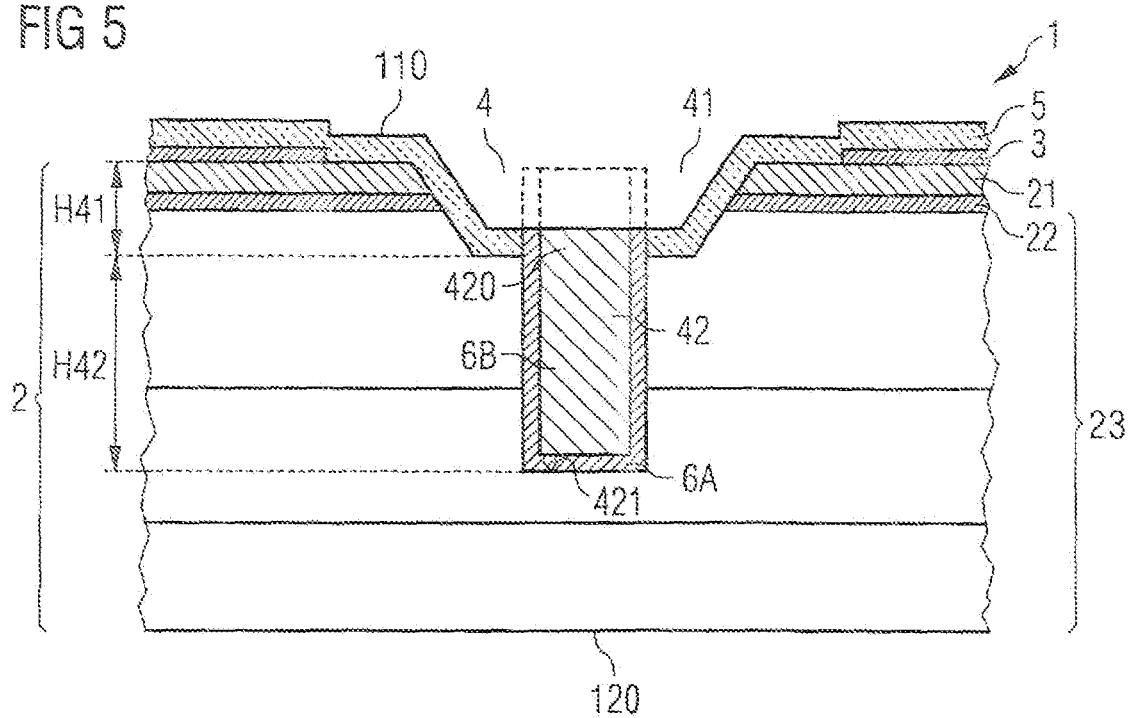
FIG. 5 shows a schematic cross-sectional view of the semiconductor body in a fifth stage of the method.

FIG. 5 illustrates the optoelectronic semiconductor body 1 in a fifth, subsequent stage. In particular, the semiconductor body 1 in accordance with the first example is completed in this stage.

In the fifth stage, the second portion 42 of the recess 4 is filled with a metal layer 6A, 6B.

For example, to produce the second portion 42 a structured masking layer is applied and the electrically insulating layer 5 and the semiconductor layer sequence 2 are removed through the masking layer—i.e., by dry-etching. In one case, this masking layer is also used as a masking layer for the deposition of the metal layer 6A, 6B. Therefore, it is possible in a simple manner to position the metal layer 6A, 6B in a particularly precise manner with respect to the second portion 42.

In this case, the metal layer consists of a reflector layer 6A which completely covers the surface of the second portion 42. Alternatively, the metallic reflector layer 6A can also be applied only to the base surface 421 of the second portion or only to a partial region of the base surface 421.

In other words, the metallic reflector layer 6A is disposed in particular in a boundary region of the second portion 42, whereas a central region of the second portion 42 is free of the metallic reflector layer. The central region is filled with a metallic current distribution layer 6B. This can be optionally omitted.

The metallic reflector layer 6A preferably contains a metal or an alloy having a large reflection coefficient. For example, the metallic reflector layer 6A consists of silver. The metallic current distribution layer 6B can consist of the same material as the metallic reflector layer 6A. It can also comprise a different metal or a different alloy. For example, the metallic current distribution layer 6B consists of gold or silver.

The metal layer 6A, 6B does not need to fill the second portion 42 completely. Alternatively, it can also fill the second portion 42 completely and protrude beyond the opening 420 thereof in the direction of the rear face 110 and into the first portion 41. This is indicated in FIG. 5 by the dashed lines. For example, the metal layer 6A, 6B protrudes column-like into the first portion 41 so that it tills a central region of the first portion 41 and leaves free a boundary region of the first portion 41 which is circumferential with respect to the central region.

Figure 6:
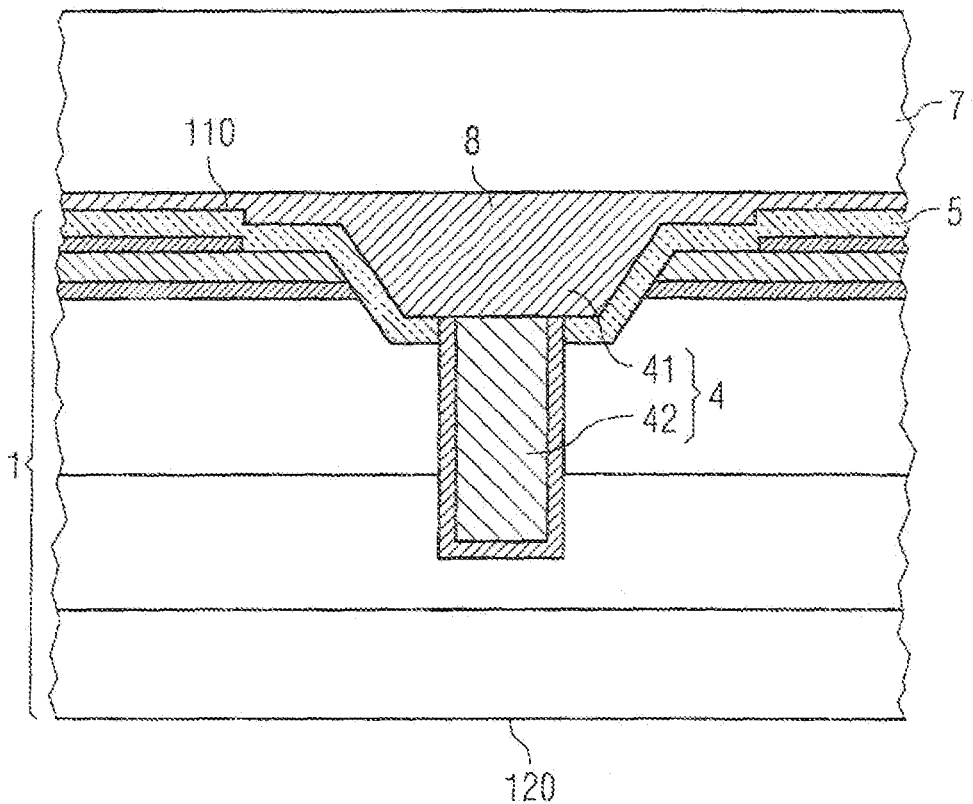
FIG. 6 shows an optoelectronic semiconductor chip in accordance with a first example.

FIG. 6 illustrates a first example of an optoelectronic semiconductor chip in a schematic cross-sectional illustration.

The optoelectronic semiconductor chip comprises an optoelectronic semiconductor body 1, in this case e.g. an optoelectronic semiconductor body 1 in accordance with the first example, as illustrated in FIG. 5. In addition, the semiconductor chip comprises a support plate 7, e.g. consisting of Ge or Si.

The semiconductor body 1 is attached with its rear face 110 to the support plate 7 by a solder 8. The solder fills up the recess 8. In other words, the regions of the recess 4 which are free of the metal layer 6A, 613 and the electrically insulating layer 5 are filled, in particular completely filled, with the solder 8.

If the metal layer 6A, 613 extends beyond the opening 420 of the second portion of the recess 4 into the first portion 41, as explained in conjunction with FIG. 5, the solder fills in particular the boundary region of the first portion 41. If the second portion 42 is not completely filled by the metal layer 6A, 6B, the region 42 of the second portion which is free of the metal layer 6A, 6B is likewise filled with the solder. In this case, the free region of the recess 4 which is filled with solder has a volume of less than or equal to 500 $\mu m^3$, e.g. between 500 $\mu m^3$ and 300 $\mu m^3$, wherein the limits are included.

FIG. 8 illustrates a schematic cross-sectional view of an optoelectronic semiconductor body in accordance with a second example. FIG. 9 illustrates a schematic plan view of a section of the rear face 110 of the semiconductor body in accordance with the second example.

In contrast to the first example, in the case of the semiconductor body 1 in accordance with the second example the second portion 42 of the recess 4 does not extend starting from a base surface 411 of the first portion 41 in the direction of the front face 120 into the semiconductor layer sequence 2. Rather, in a plan view of the rear face 110 of the semiconductor body 1 the first portion 41 and the second portion 42 of the recess 4 do not overlap.

Instead, the first portion 41 extends in an annular manner around the second portion 42. The first portion 41 is in the form of a trench which, in a plan view of the rear face 110, completely surrounds the second portion 42.

In this manner, in a plan view of the rear face 110 an outer contour of the first portion 41 surrounds a region 200 of the semiconductor layer sequence 2. The region 200 has a boundary region 210, in which the first portion 41 of the recess 4 is disposed. The boundary region 210 completely surrounds a central region 220 of the region 200, in which the second portion 42 is disposed.

In this case, the second portion 42 extends from an opening 420 in the first main surface 101 of the semiconductor layer sequence 2 through the layer of the first conductivity type 21 and through the active layer 22 and into the layer of the second conductivity type 23. In particular, it extends through, the first region 231 of the layer of the second conductivity type 23 into the second, heavily doped region 232 of the layer 23 of the second conductivity type.

The surface of the second portion 42 is covered with a reflective metal layer 6A. It short-circuits the active layer 22 in the central region 220 of the region 200 which is surrounded by the outer contour of the first portion 41. However, with the first portion 41, the part of the active layer 22 which is disposed in the central region 220 is separated from the part of the active layer 22 which is disposed outside the region 200. The short-circuit of the active layer 22 in the central region 220 thus does not play any role with regard to the functional capability of the semiconductor body.

As in the case of the first example, the reflective metal layer 6A does not need to cover the surface of the second portion 42 completely. As in the case of the first example, it can also be provided in this example that at least one front-sided part of the second portion 42 or the entire second portion is filled completely with the metal layer 6A, 6B.

In the case of the semiconductor bodies in accordance with the first and the second examples, the depth H41 of the first portion is as small as possible so that when a semiconductor chip is attached to a support plate 7, as illustrated. e.g. in FIG. 6, the lowest possible volume is to be filled with the solder 8. For example, the depth H41 of the first portion 41 has a value between 200 nm and 500 nm, wherein the limits are included.

However, in an expedient manner the depth H41 is selected to be such that the active layer 21 is completely cut through. Therefore, in an advantageous manner the risk of a short-circuit of the active layer by the metal layer 6A, 6B—in particular outside the central region 220 of the region 200 surrounded by the outer contour of the first portion 41—is reduced.

The depth H42 of the second portion is preferably greater than the depth H41 of the first portion. For example, it is greater than or equal to 1 $\mu m$.

FIG. 10 illustrates a schematic cross-sectional view of an optoelectronic semiconductor chip in accordance with a second example. The semiconductor chip in accordance with the second example of FIG. 10 differs from that of the first example by virtue of the fact that the recesses 4 of the semiconductor body 1 do not comprise any differently formed first and second portions 41, 42. Instead, the side surface 402 of the recess 4 which in this case is annularly circumferential extends as a smooth surface—i.e., in particular without edges and kinks—from the rear-sided main surface 101 of the semiconductor layer sequence 2 as far as to the front-sided base surface 401 of the recess 4.

The side surface 402 of the recess is coated completely with an electrically insulating layer 5. At least a partial region, in this case a central region, of the base surface 401 is free of the electrically insulating layer 5.

A part of the base surface 401 is covered with a metal layer which in this case consists of a metallic reflector layer 6A and a metallic current distribution layer 6B. The layer of the second conductivity type 23 is electrically connected through the recess 4 by the metal layer 6A, 6B.

Starting from the base surface 401 of the recess 4, the metallic layer extends in the direction towards the rear side 110. The metal layer 6A, 6B fills preferably at least one third of the volume of the recess 4. The remaining volume of the recess, in this case a boundary region of the recess 4 which is circumferential with respect to the metal layer 6A, 6B, is filled with the solder 8, by which the semiconductor body 1 is attached to the support plate 7.

For example, the electrically insulating layer 5 is deposited initially on the entire surface of the recess 4 and is removed from the partial region of the base surface 401 with the aid of a structured masking layer. In the case of one embodiment, this masking layer can be used further during deposition of the metal layer 6A, 6B to deposit the metal layer 6A, 6B on the central region of the base surface 401 and to keep the boundary region of the recess 4 free of the metal layer 6A, 6B.

A solder stop layer (not illustrated in FIG. 10) can be disposed between the metal layer 6A, 6B and the solder 8. The solder stop layer consists e.g. of TiWN. It advantageously reduces the risk that the material of the metal layer 6A, 6B mixes with the solder 8. The solder stop layer can also be disposed onto the electrically insulating layer and/or optionally onto a region of the surface of the semiconductor layer sequence which is not covered by the metal layer 6A, 613 and the electrically insulating layer 5, in particular in the region of the base surface 401 of the recess 4.

Figure 11:
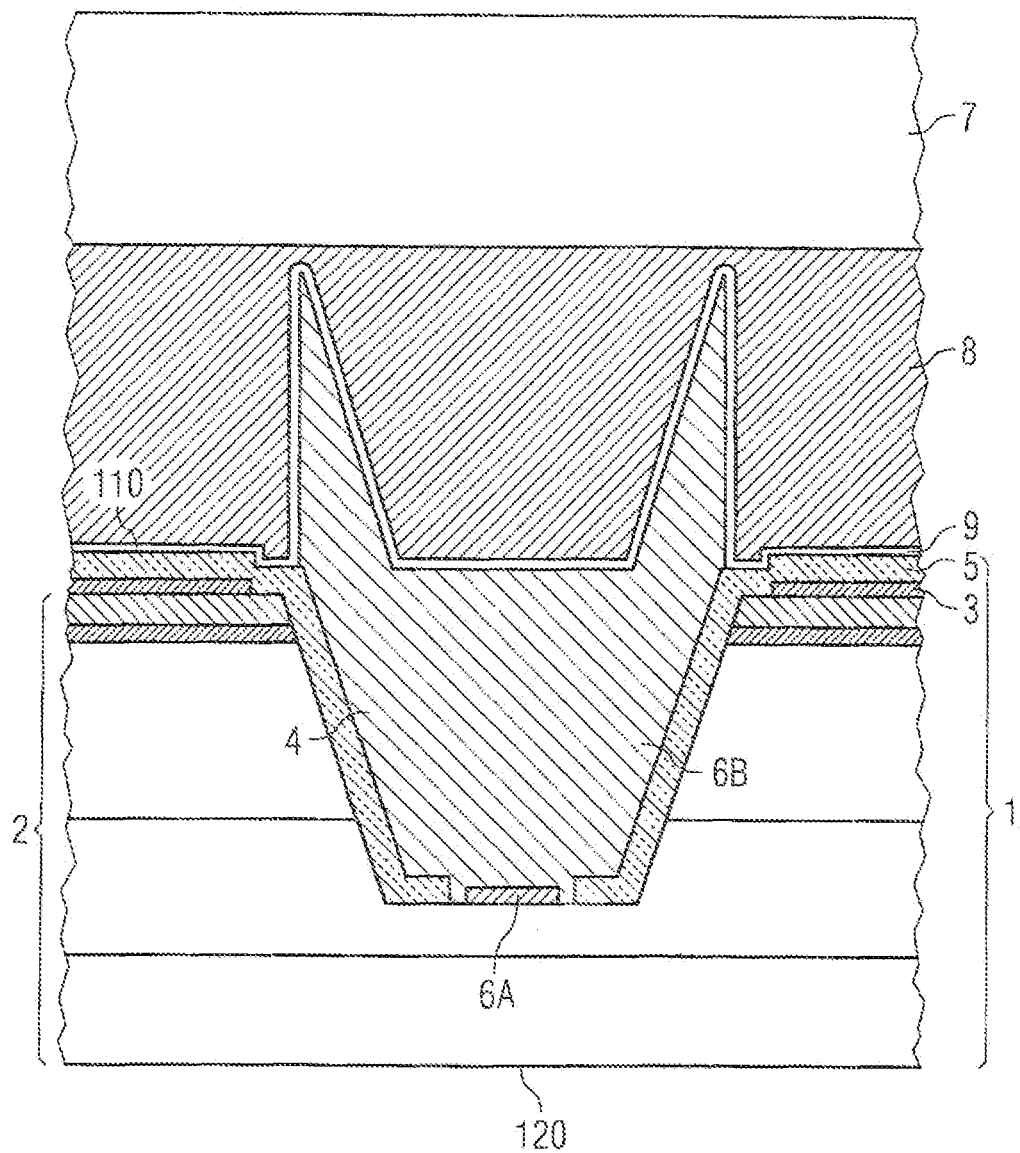
FIG. 11 shows a schematic cross-sectional view of an optoelectronic semiconductor chip in accordance with a third example.

FIG. 11 illustrates a third example of an optoelectronic semiconductor chip. The third example of the semiconductor chip differs from the second example of the semiconductor chip by virtue of the fact that the recess 4 is filled completely with the metal layer 6A, 6B.

If a structured masking layer is used to remove the electrically insulating layer 5 from a partial region of the base surface 401, in this case this is removed prior to deposition of the metal layer 6A, 6B. To define the metal layer 6A, 6B laterally onto the region of the recess 4, the metal layer 6A, 6B can be deposited with the aid of a further structured masking layer.

The annular part of the metallic current distribution layer 6B protrudes in the direction of the rear face 110 beyond the semiconductor layer sequence 2. It is also conceivable for the metal layer 6A, 6B to completely fill the recess 4, but not to protrude in the direction of the rear face 110 beyond the semiconductor layer sequence 2, the first contact layer 3 or the electrically insulating layer 5.

In the case of the present third example of the semiconductor chip, the rear face 110 of the semiconductor body 1 is coated with a solder stop layer 9 at all places, at which in a plan view of the rear face 110 it overlaps with the support plate 7, as already described in conjunction with the second example of the semiconductor chip. In particular, the solder stop layer 9 is disposed above the entire rear-sided surface of the semiconductor body 1.

Figure 12:
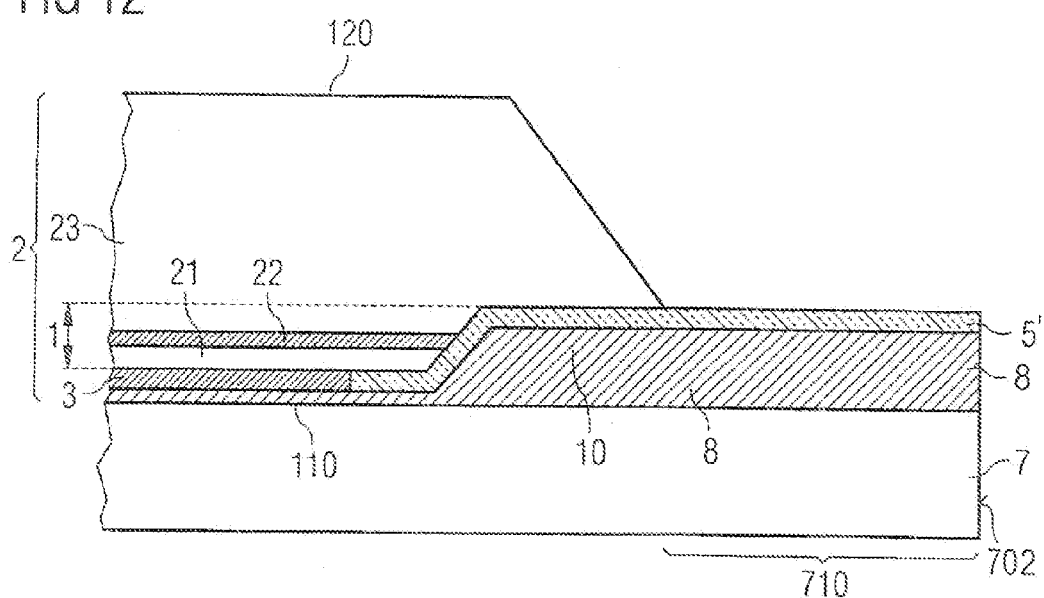
FIG. 12 shows a schematic cross-sectional view of an optoelectronic semiconductor chip in accordance with a fourth example.

FIG. 12 illustrates a schematic cross-sectional view of a boundary region of an optoelectronic semiconductor chip in accordance with a fourth example.

The semiconductor chip contains a semiconductor body 1 which comprises an active semiconductor layer sequence 2 which in the direction from the rear face 110 towards the front face 120 contains the layer of the first conductivity type, in particular the p-conductive layer 21, the active layer 22 and the layer of the second conductivity type, in particular the n-conductive layer 23. Preferably, the semiconductor body 1 also contains recesses 4, as described in conjunction with the first and second examples of the semiconductor body in conjunction with FIGS. 1-5 and 8-9 respectively.

In this case, the n-conductive layer 23 protrudes laterally beyond the p-conductive layer 21 and beyond the active layer 22. In this way, the n-conductive layer 23 together with the support plate 7 forms a groove 10 which is laterally circumferential with respect to the semiconductor layer sequence 2. The groove 10 is filled with the solder 8.

In the region of the groove 10, the semiconductor layer sequence 2—in particular the p-conductive layer 21 and the active layer 22—is covered with a passivation layer 5'. If the semiconductor layer sequence 2 contains recesses 4 which are lined at least partially with an electrically insulating layer 5, the electrically insulating layer 5 and the passivation layer 5' may constitute partial regions of one and the same layer.

The depth H41 of the groove 10—i.e. its extension in the direction from the rear face 110 towards the front face 120—is preferably as small as possible so that the solder 8 must fill a comparatively small volume. However, it is selected in such a manner that the groove 10 extends in the direction from the rear face 110 towards the front face 120 beyond the active layer 22. In particular, the groove 10 has the same depth H41 as the first portion 41 of the recess 4.

In this case, the passivation layer 5' protrudes laterally beyond the semiconductor layer sequence 2. The support plate 7 likewise protrudes laterally beyond the semiconductor layer sequence 2 so that in a plan view of the front side 120 a boundary region of the support plate 7 is free of the semiconductor layer sequence.

The passivation layer 5' extends over the entire boundary region 710 of the support plate 7. In this manner, the groove 10 is extended laterally beyond the semiconductor layer sequence 2 and is delimited in the boundary region 710 of the support plate 7 by the support plate 7 and the passivation layer 5'. The groove 10 extends as far as to a lateral edge 702 of the support plate.

Figure 13:
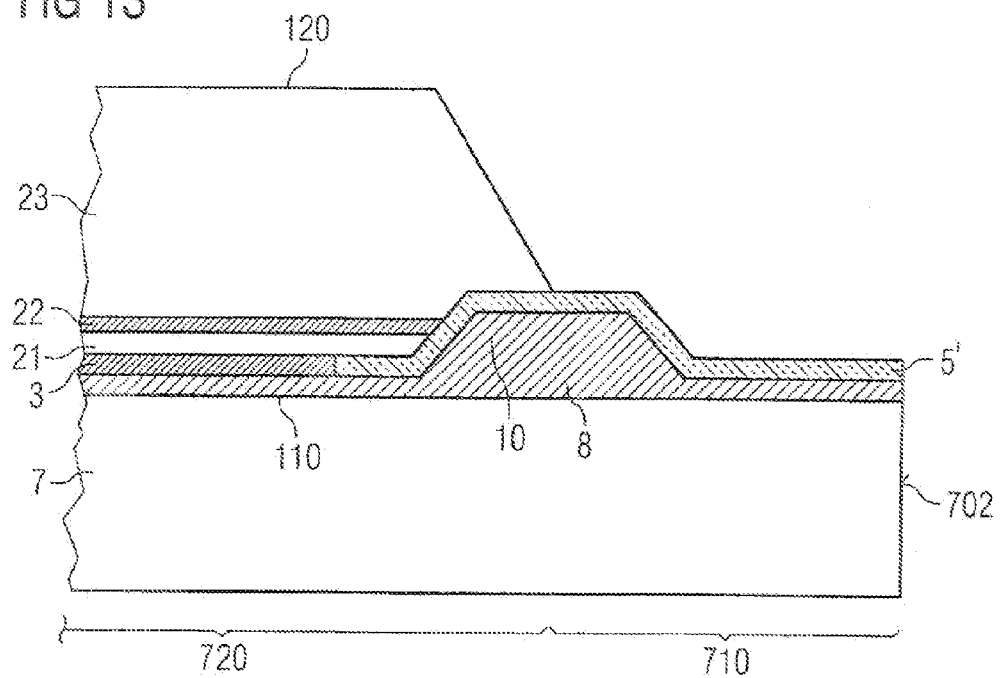
FIG. 13 shows a schematic cross-sectional view of an optoelectronic semiconductor chip in accordance with a fifth example.

FIG. 13 illustrates a schematic cross-sectional view of a boundary region of an optoelectronic semiconductor chip in accordance with a fifth example. In the course in the direction from a central region 720 towards the boundary region 710 of the support plate 7—in contrast to the example of FIG. 12—in the case of the semiconductor chip in accordance with the example of FIG. 13 the passivation layer 5' runs initially in the direction of the front face 120 away from the support plate to form the groove between the support plate 7 and the semiconductor layer sequence 2. In the further course in the direction from a central region 720 towards the boundary region 710 of the support plate 7, sideways of the semiconductor layer sequence 2, it subsequently runs in the direction of the rear face 110 towards the support plate 7, again. In this case, the groove 10 is thus extended laterally beyond the semiconductor layer sequence 2, but it does not extend as far as to the lateral edge 702 of the support plate 7 but rather extends only over a partial region of the boundary region 710 of the support plate 7.

This disclosure is not limited to the examples by way of the description with reference thereto. Rather, it includes each new feature and each combination of features even if the feature or the combination is not explicitly stated in the examples or appended claims.

The invention claimed is:

1. An optoelectronic semiconductor body comprising:
    a front face provided for emission and/or reception of electromagnetic radiation,
    a rear face which lies opposite the front face and is provided for application onto a support plate, and
    an active semiconductor layer sequence which in a direction from the rear face to the front face comprises a layer of a first conductivity, an active layer and a layer of a second conductivity in this sequence, wherein
    the semiconductor layer sequence comprises at least one recess which extends from the rear face into the semiconductor layer sequence, wherein in a lateral direction parallel to a main extension direction of the semiconductor layer sequence the recess is completely surrounded by a continuous rail of the active layer;
    the recess comprises a first portion which extends through the layer of the first conductivity and the active layer into the layer of the second conductivity and comprises in the layer of the second conductivity a base surface which comprises points of the first portion which are most distant from the rear face;
    the recess comprises a second portion having an opening, wherein in the lateral direction the opening does not completely surround a region of the active layer, and wherein in a plan view of the rear face the opening is completely surrounded by an outer contour of the base surface of the first portion, and wherein the second portion extends starting from the opening in the direction towards the front face and extends at least in the layer of the second conductivity type.

2. The optoelectronic semiconductor body as claimed in claim 1, wherein the opening of the second portion is contained in the base surface of the first portion and the second portion extends completely within the layer of the second conductivity type.

3. The optoelectronic semiconductor body as claimed in claim 1, wherein the first portion is formed as a trench which extends around the opening of the second portion, and the second portion extends through the layer of the first conductivity type and the active layer into the layer of the second conductivity type.

4. The optoelectronic semiconductor body as claimed in claim 1, wherein a side surface of the first portion extends obliquely with respect to a main extension plane of the semiconductor layer sequence.

5. The optoelectronic semiconductor body as claimed in claim 1, wherein the second portion is filled at least partially with a metal layer.

6. The optoelectronic semiconductor body as claimed in claim 1, wherein a surface of the first portion is coated at least in places with an electrically insulating layer and a surface of the second portion is free of an electrically insulating layer.

7. The optoelectronic semiconductor body as claimed in claim 1, wherein a region of the base surface of the first portion which is completely circumferential with respect to the opening of the second portion has a minimum lateral extension of greater than or equal to 1 μm.

8. An optoelectronic semiconductor chip comprising a support plate and
an optoelectronic semiconductor body comprising:
a front face provided for the emission and/or reception of electromagnetic radiation,
a rear face which lies opposite the front face and faces towards the support plate, and
an active semiconductor layer sequence which in the direction from the rear face to the front face comprises a layer of a first conductivity, an active layer and a layer of a second conductivity in this sequence, wherein
the semiconductor layer sequence comprises at least one recess which extends from the rear face into the semiconductor layer sequence, wherein in a lateral direction parallel to a main extension direction of the semiconductor layer sequence the recess is completely surrounded by a continuous rail of the active layer,
the recess comprises a first portion which extends through the layer of the first conductivity and the active layer into the layer of the second conductivity and comprises in the layer of the second conductivity a base surface which comprises points of the first portion which are most distant from the rear face,
the recess comprises a second portion having an opening, wherein the opening is located in the base surface of the first portion, wherein in the lateral direction the opening does not completely surround a region of the active layer, and wherein in a plan view of the rear face the opening is completely surrounded by an outer contour of the base surface of the first portion, and wherein the second portion extends starting from the opening in the direction towards the front face and lies completely within the layer of the second conductivity, and
a solder, wherein the rear face of the semiconductor body is attached to the support plate by the solder, and wherein the solder fills at least the first portion of the recess.

9. An optoelectronic semiconductor chip comprising a support plate and an optoelectronic semiconductor body comprising:
a front face provided for emission and/or reception of electromagnetic radiation,
a rear face which lies opposite the front face, faces towards the support plate and is attached thereto by solder, and
an active semiconductor layer sequence which in the direction from the rear face to the front face comprises a layer of a first conductivity, an active layer and a layer of a second conductivity in this sequence and has at least one recess which extends from the rear face into the semiconductor layer sequence and extends through the layer of the first conductivity and the active layer into the layer of the second conductivity, wherein in a lateral direction parallel to a main extension direction of the semiconductor layer sequence the recess is completely surrounded by a continuous rail of the active layer, wherein in the lateral direction the recess does not completely surround a region of the active layer, and wherein at least one third of the volume of the recess starting from a front-sided base surface of the recess is filled with a metal layer consisting of a material which is different from the solder, wherein in a plan view of the rear face the metal layer covers only a partial region of the front-sided base surface, wherein a region of the recess which is circumferential with respect to the metal layer is filled with the solder.

10. The optoelectronic semiconductor chip as claimed in claim 9, wherein the metal layer protrudes in the direction of the rear face beyond the semiconductor layer sequence.

11. The optoelectronic semiconductor chip as claimed in claim 9, wherein a solder stop layer is disposed between the metal layer and the solder.

12. The optoelectronic semiconductor chip as claimed in claim 8, wherein the layer of the second conductivity type protrudes laterally beyond the active layer and the layer of the first conductivity, such that together with the support body it forms a groove which is circumferential with respect to the semiconductor layer sequence and through which a main extension plane of the active layer extends and wherein the groove is filled with the solder.

13. The optoelectronic semiconductor chip as claimed in claim 12, wherein in the direction from the front face to the rear face the groove has an extension of less than or equal to 500 nm.

14. The optoelectronic semiconductor chip as claimed in claim 12, wherein a boundary region of the support plate protrudes laterally beyond the semiconductor layer sequence, a surface region of the semiconductor layer sequence is provided at least in the region of the groove with a passivation layer, and the passivation layer extends laterally from the semiconductor layer sequence at least over a part of the boundary region of the support plate such that the groove which is filled with solder is extended laterally beyond the semiconductor layer sequence.

15. The optoelectronic semiconductor body as claimed in claim 1, wherein depth of the second portion is greater than depth of the first portion.

16. The optoelectronic semiconductor body as claimed in claim 15, wherein the first portion has a depth of less than or equal to 500 nm and the second portion has a depth of greater than or equal to 1 μm.

17. The optoelectronic semiconductor body as claimed in claim 1, wherein the first portion is laterally delimited by at least one side surface and the second portion is laterally delimited by at least one further side surface and the at least one side surface of the first portion extends more flatly than the at least one further side surface of the second portion.

18. The optoelectronic semiconductor chip as claimed in claim 8, wherein the second portion is filled at least partially with a metal layer, the metal layer consisting of a material which is different from the solder.

* * * * *